(12) United States Patent
Kim et al.

(10) Patent No.: US 6,442,729 B1
(45) Date of Patent: Aug. 27, 2002

(54) CONVOLUTION CODE GENERATOR AND DIGITAL SIGNAL PROCESSOR WHICH INCLUDES THE SAME

(75) Inventors: Jae-Yeol Kim, Seoul; Keun-Moo Lee, Daejon; Jin-Hyuk Yang, Daegu; Chong-Min Kyung; Yong-Hoon Lee, both of Daejon, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/323,223

(22) Filed: Jun. 1, 1999

(30) Foreign Application Priority Data

Jun. 3, 1998 (KR) ............................................. 98/20616

(51) Int. Cl.[7] ......................................... H03M 13/03
(52) U.S. Cl. ...................................................... 714/786
(58) Field of Search .................................. 714/792, 786

(56) References Cited

U.S. PATENT DOCUMENTS

| | | | | |
|---|---|---|---|---|
| 3,891,959 A | * | 6/1975 | Tsuji et al. ................... | 714/786 |
| 4,119,945 A | * | 10/1978 | Lewis, Jr. et al. ........... | 714/793 |
| 4,159,469 A | * | 6/1979 | Zdunek ........................ | 714/786 |
| 4,483,012 A | * | 11/1984 | Wei ............................. | 375/244 |
| 4,486,882 A | * | 12/1984 | Piret et al. ................... | 714/788 |
| 5,193,094 A | * | 3/1993 | Viterbi ........................ | 714/795 |
| 5,319,649 A | * | 6/1994 | Raghavan et al. ........... | 714/780 |
| 6,081,921 A | * | 6/2000 | Simanapalli ................ | 714/786 |

* cited by examiner

*Primary Examiner*—Albert Decady
*Assistant Examiner*—Joseph D. Torres
(74) *Attorney, Agent, or Firm*—Fleshner & Kim, LLP

(57) ABSTRACT

A convolution code generator according to the present invention simultaneously generates convolution codes with respect to input data word by word when a digital signal processor in which the convolution code generator can be installed has a bus configuration of a broad data width. The convolution code generator, which generates an (n, k, m) convolution code, wherein n is a code word length, k is a message block length, and m is a memory block, includes: a temporary data storing unit for temporarily storing input data of a word of a predetermined data width consisting of a plurality of bits, the temporary data storing unit including cells of a first group corresponding to a word and m−1 cells of a second group; and a plurality of exclusive logic operation units selectively connected to the cells of the first and second groups for generating the (n, k, m) convolution code with respect to input bits stored in the cells, wherein a part of data of a previous word is stored in the cells of the second group with respect to a present word stored in the cells of the first group. Also, according to the present invention, there is provided a digital signal processor including the convolution code generator.

13 Claims, 3 Drawing Sheets

CONVOLUTION CODE GENERATOR AND DIGITAL SIGNAL PROCESSOR WHICH INCLUDES THE SAME

BACKGROUND OF THE INVENTION

1. Field of the Invention

The present invention relates to convolution code generation, and more particularly to a convolution coder of a digital signal processor which consists of a hardware in the digital signal processor and provides a plurality of convolution codes by a single instruction.

2. Description of the Background Art

Data must be transmitted to a receiving part without any error in transmission and reception of digital data. However, since errors can be made in general during the data transmission and reception, many ways have been proposed and actually used to prevent the errors. These can be referred to as an error correction code technique, which includes a block coding and a convolution coding. The present invention relates to the convolution coding technique, in particular, which has been recently used for cellular phones.

To process digital signals, a digital signal processor (DSP) is exclusively used. The DSP has a function of convolutely coding data and supplying the coded data to a digital data receiving part, to transmit the data without error employing the digital processor which provides numerous functions related to the digital signal processing. Now, the convolution coding performed in a conventional DSP will be described.

Generally, for bit-operation in the DSP there are provided instructions such as arithmetic shift or logical shift, AND, OR, EX-OR (exclusive OR), etc., and also there is provided an instruction for fetching a bit in a single word. Therefore, a convolution coding which is a specific signal processing with respect to an input signal is performed using the above-mentioned instructions for the bit operation supplied by the DSP.

Now, the convolution coding will be described with reference to FIG. 1 which is a conceptional diagram. A convolution code with respect to inputted data x(n) is obtained as shown therein. Since an exclusive unit for such a convolution coding does not physically exist in the DSP, the convolution coding is processed using a plurality of instructions.

As shown therein, the convolution coding process, marked a referential numeral 1, produces a convolution code with respect to the inputted data x(n) using a shift register 2 and exclusive logic elements 3, 4. In FIG. 1 when expressing convolution codes n, k, m, these are assumed to be 2, 1, 5, respectively. Here, n is a code word length, that is, the number of bits which are encoded and outputted by the convolution coding each time step, which is 2 in accordance with the above example, k is a message block length which indicates the number of data inputted by each time step, wherein 1 bit is inputted each time step in the above example, and m is a memory block and indicates the number of shift registers in which the inputted data are stored, as shown in FIG. 1, which is required to use a register having 5 cells. x(n) indicates data inputted from a time step n.

Since the input data x(n) is shifted to the left to the right side of the shift register 2 each time step, a first cell $D_1$, a fourth cell $D_4$ and a fifth cell $D_5$ of first to fifth cells $D_1$–$D_5$ constituting the shift register 2 are exclusively logic-operated by the first exclusive logic element 3, thereby generating a first output $G_0(n)$. In addition, a second output $G_1(n)$ is generated with respect to the first cell $D_1$, the second cell $D_2$, the fourth cell $D_4$ and the fifth cell $D_5$ by the second exclusive logic element 4. Thus, the above processes can be expressed as follows.

$$G_0(1)=x(n)+x(n-3)+x(n-4)$$
$$G_1(1)=x(n)+x(n-1)+x(n-3)+x(n-4) \quad (1)$$

In the above example of the (2, 1, 5) convolution code process, when a single bit is inputted to the shift register 2, a couple of outputs are generated by the exclusive logic operation with respect to a bit value in cells which are selected in the time step or a modular-2 addition. That is, whenever a single bit inputted, 2 bits are outputted.

However, since the instructions for the bit operation provided by the DSP must be used in the convolution coding to the input data stream, a sequential instruction performance is required. In other words, the instructions are used in the digital signal processor, the data stream given by sequential instructions becomes convolutely coded.

First, the bit stream constituting a data stream to be inputted is sequentially stored from a highest bit to a lowest bit in a specific part of a memory word by word. Accordingly, the memory includes, for example, a k number of words. Then, when the number of bits included in a single word is N, considering a general size, as shown in FIG. 1, a following process is required with respect to code each bit through the convolution coding.

That is, each bit is coded by a bit-in-word reading step reading x(n) in a current bit as a currently inputted single bit; a data shifting step performing a shifting operation with previously inputted data; an exclusive-logic operating step operating a 2-input exclusive logic with respect to each bit value included in selected cells of the shift register; and a storing step storing $G_0$, $G_1$ which are the results from the previous step in a memory location, the sequence of the process being accomplished using the instructions of the DSP. Accordingly, since every step of the above process must be performed with respect to the entire data, it can be seen that the four steps must be carried out K×N times.

Since each step must be designated in a software, there are required a plurality of instructions. Further, although an assembly instruction is in charge of a single process and the process can be performed in one cycle, at least 10 cycles are needed since there are 5 shift register cells. Thus, there is required an operation volume which needs cycles of at least 10×N×K with respect to the entire input data.

In a commonly used digital signal processor, because an operation by each bit is needed to process the convolution coding, instructions performed by each bit are used but the process of the bit unit operation is not possibly performed in the DSP having a data bus system such as 16, 24 or 32 bits, for example. Although it is possible to process the bit unit operation, the bit unit operation must be repeatedly applied to a data word of a data bus width, that is, a 16, 24, or 32-bit width, as many as the number thereof. The convolution coding process consists of the shifting and the exclusive logic operation appropriate to the process by each bit unit, which are relatively simple operations. However, using read/write, shift, and exclusive logic operation instructions which are to be processed in a word unit of the DSP suitable to process a broad data bus width is not desirable since it can not be effectively utilized in usefulness of resources which are supplied for enabling the above process.

SUMMARY OF THE INVENTION

Accordingly, the present invention is directed to a convolution code generator which obviates the problems and disadvantages in the conventional art.

An object of the present invention is to provide a convolution code generator that is implemented in a hardware which is suitable for performing a convolution coding operation of a plurality of bits consisting of input data.

Another object of the present invention is to provide a convolution code generator appropriate for processing a convolution coding by a data bus width unit ill a digital signal processor which is suitable to process a relatively broad data bus width.

To achieve these and other advantages and in accordance with the purpose of the present invention, as embodied and broadly described herein, there is provided a convolution code generator, which generates an (n, k, m) convolution code, wherein n is a code word length, k is a message block length, and m is a memory block, which includes: a temporary data storing means for temporarily storing input data of a word of a predetermined data width consisting of a plurality of bits, the temporary data storing means including cells of a first group corresponding to a word and m−1 cells of a second group; and a plurality of exclusive logic operation means selectively connected to the cells of the first and second groups for generating the (n, k, m) convolution code with respect to input bits stored in the cells, wherein a part of data of a previous word is stored in the cells of the second group with respect to a present word stored in the cells of the first group.

To achieve the above objects of the present invention, according to a preferred embodiment of the present invention, there is provided a convolution code generator, which generates a (2, 1, 5) convolution code, wherein 2 is a code word length, 1 is a message block length, and 5 is a memory block, including: a temporary data storing means for temporarily storing input data of a word of a predetermined data width consisting of a plurality of bits, the temporary data storing means including cells of a first group corresponding to a word and 4 cells of a second group; and a plurality of exclusive logic operation means selectively connected to the cells of the first and second groups for generating the (2, 1, 5) convolution code with respect to input bits stored in the cells, wherein a part of data of a previous word is stored in the cells of the second group with respect to a present word stored in the cells of the first group, the plurality of exclusive logic operation means including first to fourth exclusive logic operation means for performing exclusive logic operations of the cells of the first group which are adjacent to each other; an exclusive logic operation means for performing an exclusive logic operation of a cell in which a bit is stored and an output of the fourth exclusive operation means to generate a first convolution code with respect to the bit; and another exclusive logic operation means for performing an exclusive logic operation of outputs of the first and fourth exclusive operation means to generate a second convolution code with respect to the bit.

Further, to achieve the above objects of the present invention, there is provided a digital signal processor for processing a digital input, which includes a memory, an accumulator and a plurality of signal processing units and has a bus connected with the devices for input/output of data, the digital signal processor including: a convolution code generating means for generating an (n, k, m) convolution code wherein n is a code word length, k is a message block length, and m is a memory block and loading the convolution code to the accumulator through the bus, the convolution code generating means including; a convolution code generator having a temporary data storing means for temporarily storing input data of a word of a predetermined data width consisting of a plurality of bits, the temporary data storing means including cells of a first group corresponding to a word and m−1 cells of a second group; and a plurality of exclusive logic operation means selectively connected to the cells of the first and second groups for generating the (n, k, m) convolution code with respect to input bits stored in the cells, wherein a part of data of a previous word is stored in the cells of the second group with respect to a present word stored in the cells of the first group.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
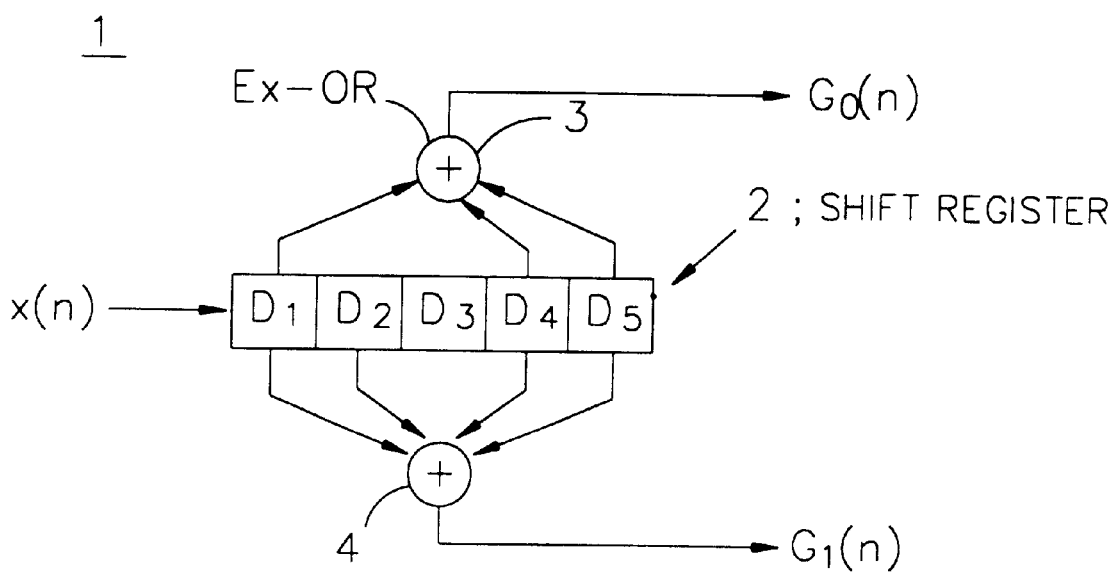
FIG. 1 is a diagram illustrating a convolution code generating process in a conventional art.

Reference will now be made in detail to the preferred embodiments of the present invention, examples of which are illustrated in the accompanying drawings.

According to the present invention, to perform a convolution coding to input data to be processed in the DSP, a single word as an instruction, that is, data inputted in a 16, 24, or 32-bit unit are simultaneously convolution-coded in accordance with a configuration of a bus. For the convolution coding of the present invention, an instruction referred to as a CVENC can be used. Accordingly, a user using the DSP in which a convolution code generator is installed can achieve a required convolution coding process with the single CVENC instruction. Thus, as the instruction CVENC is processed during a process routine in the DSP, convolution codes to an input word of a 16-bit width, for example, are simultaneously generated and outputted, which can be compared to which the convolution code is obtained by each of bits generated various time units in the conventional art.

To process such a CVENC instruction, the following process is included. First, a word of a predetermined width stored in a memory is stored in a temporary data storing unit according to the present invention provided in the DSP in accordance with the instruction. Here, it is noted that the word does not only necessarily designate a 16-bit width, but also can be 24, 32 bits or above in accordance with the configuration of the bus of the DSP.

A plurality of logic devices are combined in the temporary data storing unit. The logic devices are provided for physically perform a logic operation for the convolution coding process in a hardware system. A value stored in each of the cells constituting the temporary data storing unit is applied to the logic devices. Thus, a plurality of convolution codes which are simultaneously produced are not needed to be operated in a bit unit and become suitable for the DSP of a broad bus width configuration. Then, the convolution codes with respect to the input data of a predetermined bit, which are simultaneously obtained, can be written in a predetermined area of the memory, or input data and processed outputs for the convolution coding can be provided to a bus and an accumulator in an internal system of the DSP, so that the convolution coding can be processed for a next process in the DSP.

The convolution code generator according to the present invention provides an advantage in that it is easy to design an ASIC (an application-specific integrated circuit). As can be seen in a following example, the convolution code generator can simply respond to the requirement of the ASIC with the change of connection between the temporary data storing unit and the logic circuits. Further, since the convolution code generator according to the present invention can process with a single instruction, a burden of software creation can be reduced.

An example in which the above mentioned process is described in assembly instructions according to the present invention is as follows. Following instructions are an example of a program which can be made for the convolution coding process using the DSP of the present invention.

MVFRM AO, *AR0++
CVENC
MVTOM AO1, *AR1++
MVTOM AO2, *AR1

The above instructions are processed in order in the DSP. When such a group of instructions is given, the convolution code generator reads 16 bits, for instance, and generates a convolution-coded output of 32 bits. Thus, when such a routine of the group of the instructions is repeated, a series of an input stream is supplied being convolutely coded.

In the above instructions, MVFRM is an instruction that reads 1 word from a memory address which ARO indicates to the accumulator AO. MTVOM is an instruction indicating an order to store 1 word in a memory address indicated by AR1. The accumulator AO can have at least 32 bits in which lower 16 bits are designated as AO1, while upper 16 bits as AO2. Further, ARO and AR1 are pointers to designate an address and ++ means that a stored value, that is, an address increases one by one after reading the value.

In the present invention, being outputted as 32 bits, the result is stored over two times considering a case where it is needed to store the result over the two times, however such an example is varied in accordance with an application and also does not limit the scope of the present invention. Also, it is noted that the above specific numerical example is provided for the explanation of the present invention and each symbol of the group of the instructions is from the specific numerical example. However, such a general process can be similarly applied to various applications and further those who are skilled in the this field will be able to easily achieve the process.

In the convolution code according to- the embodiment of the present invention, a ratio of an input to an output is 1:2, but it is also possible to have the ratio of 1:3 or 1:4 of the convolution code. In this case, other instructions and a hardware thereof can be similarly defined in accordance with a principle supplied by the present invention, which can be easily performed by those skilled in this field. For example, when at least two convolution codes are used in one system, the codes can be defined as CVENC_1 and CVENC_2, respectively.

The generation of the convolution code basically has a time order such as a 2-bit output to an 1-bit input, but in the present invention when 16 bits are inputted in each unit, 32 bits are calculated and outputted in one cycle.

Now, there will be detailedly described a convolution code generator provided in the DSP according to a preferred embodiment of the present invention.

The preferred embodiment of the present invention relates to a (2, 1, 5) convolution code generator and the DSP including the same has a configuration of a bus of a 16-bit width. Here, 16-bit data are simultaneously transmitted through the bus of the 16-bit width, which is applied as 16-bit data to the convolution code generator which is provided in the DSP as a hardware.

The (2, 1, 5) convolution code generator generates a couple of convolution codes with respect to a single input bit, expressing 1 bit with respect to the single input bit and 4 bits which have been previously inputted in 1 unit, each bit constituting input data of 16 bits which are stored in a memory (not shown).

Figure 2:
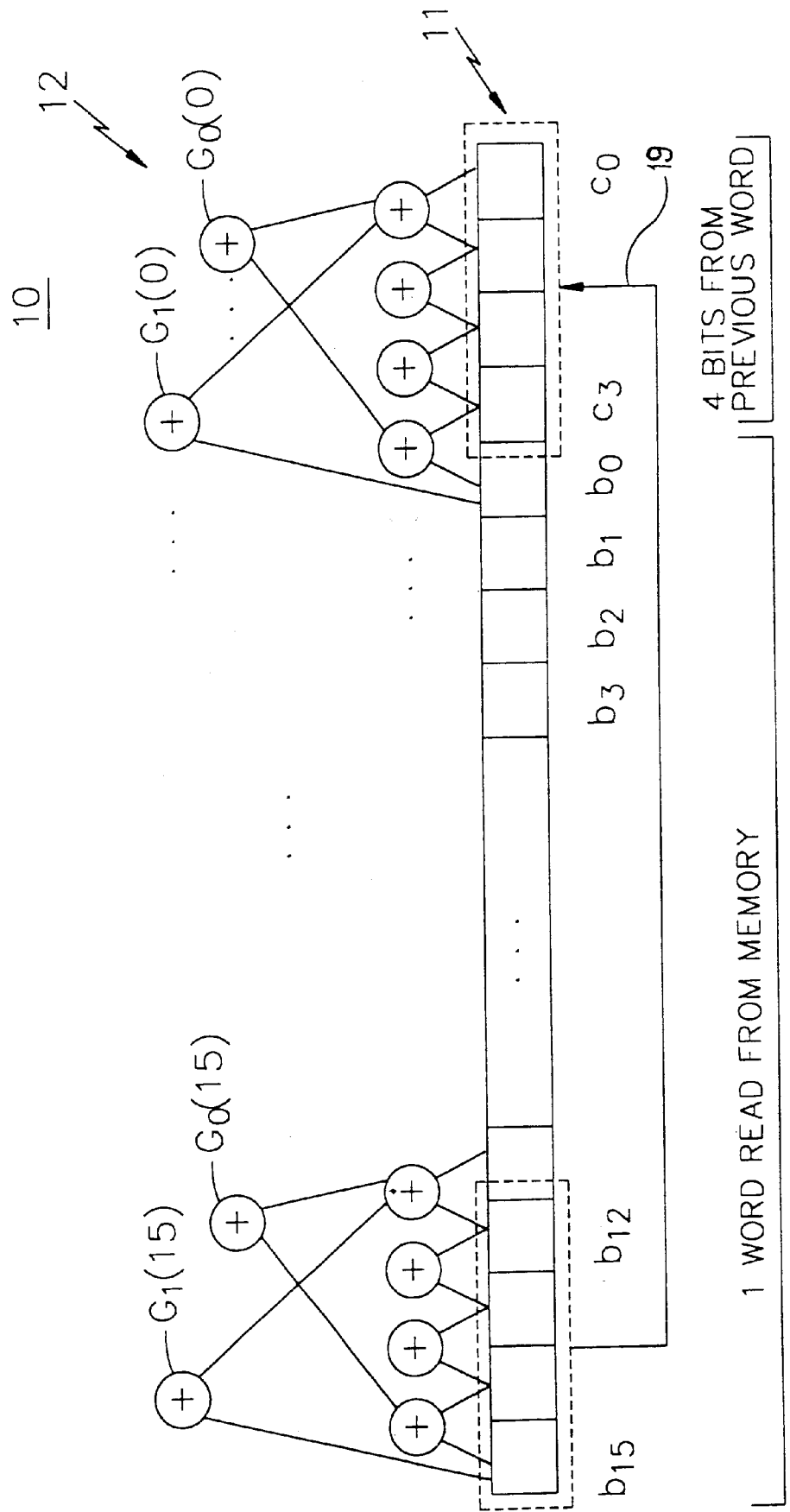
FIG. 2 is diagram illustrating a hardware configuration of a convolution code generator according to an embodiment of the present invention.

FIG. 2 is a schematic diagram illustrating the convolution generator 10 according to the embodiment of the present invention. As shown therein, the convolution code generator 10 according to the present invention includes a temporary data storing unit 11 consisting of cells having at least a bus width of the DSP and a plurality of device units 12 selectively connected with the cells and providing a predetermined convolution code, the above units being physically implemented in the DSP and being possibly connected to other elements thereof, such as the accumulator and the bus thereof. First, for the convolution coding process according to the present invention, 16-bit data are loaded from the memory (not shown) to the temporary data storing unit 11 in accordance with the instruction MVFRM. Then, the 16-bit data or word, in which a highest bit is designated to a first cell b15, the first one from the left side and a lowest bit to a cell b0, the sixteenth cell therefrom, as shown therein, is stored in the temporary data storing unit 11.

The temporary data storing unit 11 consists of 20 cells, which has 4 cells more than 1 word, the 4 cells being required to generate a convolution code between adjacent words.

The temporary data storing unit 11 having the 20 cells b15–b0, c3–c0 preferably consists of D-flipflops. Further, cells c3–c0 assigned to the right side of the temporary data storing unit 11 stores a part of data from a previous word to consecutively generate convolution codes between a previous word and a currently processed word. Accordingly, after the current word is processed, the data of the 4-bit word is partially stored in the 4-bit cells on the right side of the temporary data storing unit 11, thus outputs of the D-flipflops constituting the cells b15–b12 are connected to a plurality of exclusive logic devices and to inputs of D-flipflops of cells c3–c0, respectively.

Figure 3:
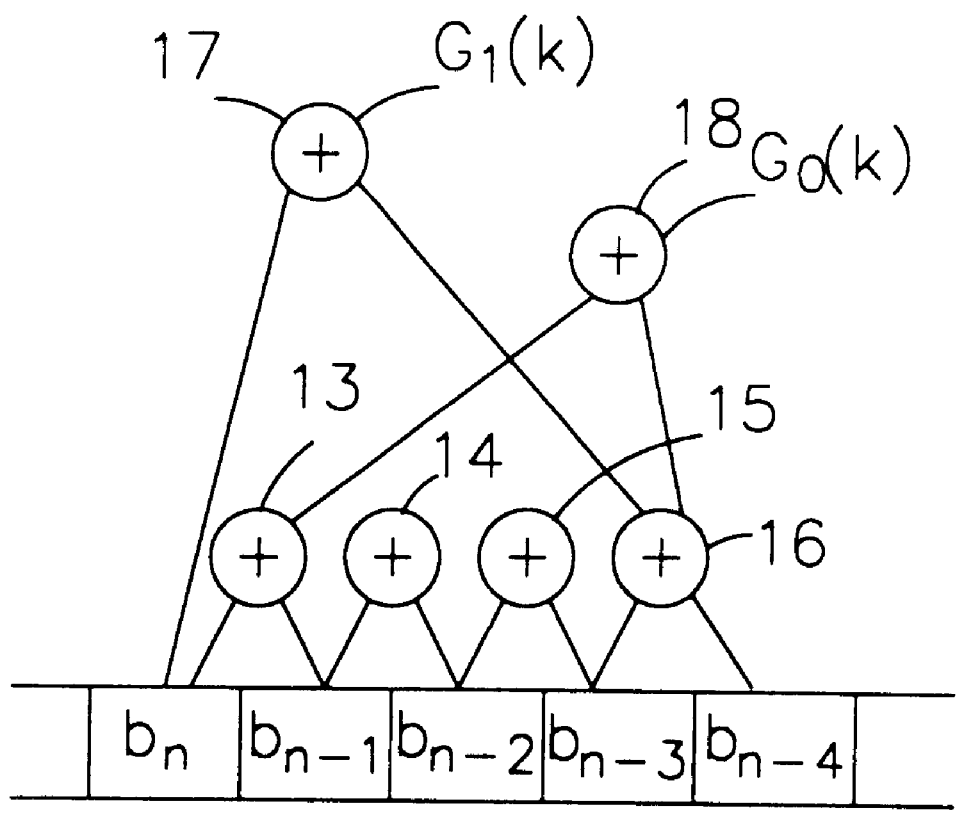
FIG. 3 is a diagram illustrating a configuration for generating a convolution code with respect to an n th bit of FIG. 2.

Contents of the cells of the temporary data storing unit 11 are inputted to the logic devices connected thereto. Since the embodiment of the present invention relates to the (2, 1, 5) convolution code, cells bn, bn-1, . . . , bn-4 which are selected for an n th bit of the temporary data storing unit as shown in FIG. 3 have to be connected to a plurality of EX-OR gate logic devices 13–18. Such a relation is also applied to the temporary data storing unit 11 of FIG. 2.

In accordance with the relation among the gates thereof, a connection relation of logic devices can be derived. In other words, with respect to an n th bit, there are provided n th to n-4 th cells bn, bn-1, bn-2, bn-3, bn-4 and first to fourth EX-OR gate logic devices 13–16 for an exclusive logic operation between the adjacent cells. Further, when k is a voluntary time unit, a first convolution code $G_0(k)$ to the n th bit is generated by an EX-OR gate logic device 18 provided for the EX-OR logic operation between the first EX-OR gate logic device 13 and the fourth EX-OR gate logic device 16, and a second convolution code $G_1(k)$ is generated by another EX-OR gate logic device 17 provided for the EX-OR logic operation between the n th cell bn and the fourth EX-OR gate logic device 16. Such a configuration is implemented by a hardware being applied to each cell. The relation of the logic devices is based on the following formulas.

$$G_0[k]=r[k+4]+r[k+1]+r[k]$$
$$G_1[k]=r[k+4]+r[k+3]+r[k+1]+r[k] \quad (1)$$

wherein, r is a cell of the temporary data storing unit.

Thus, the first convolution code of $G_0(0)$ to $G_0(15)$ and the second convolution code of $G_1(0)$ to $G_1(15)$ are simultaneously obtained. Such convolution codes are stored in an accumulator (not shown) of 32 bits in the DSP or another storing location for the following process.

Here, to continue a consecutive operation of a following word, as shown in FIG. 2, the values stored in the 4 cells b15–b12 from the highest bit are again stored in the 4 cells c3–c0 on the right side of the temporary data storing unit 11, and then a following word is stored in the 16 cells b15–c0 from a highest bit thereof, the above process being repeatedly performed.

According to the preferred embodiment of the present invention, since the temporary data storing unit 11 includes more cell that a length of a word, in which cells of m−1 which is one less than m indicating a memory block in (n, k, m) of the convolution code are allocated to the cells on the right side of FIG. 2, the length of the cells varies in accordance with (n, k, m). Because, as can be seen in FIG. 2, there are required the lowest bit of the current word and the 4 bits of the previous word to calculate $G_0(0)$ an $G_1(0)$.

Thus, as indicated by an arrow (19) in FIG. 2, the upper 4 bits of the current word stored in the cells b15–b12 of the temporary data storing unit 11 are stored in the cells c3–c0 thereof when performing the convolution coding process to a next word and a following word is stored in the cells b15–b0, the operation being repeatedly performed for thereby carrying out the convolution coding process to the consecutive input streams.

The embodiment according to the present invention describes the example of planning the DSP of a data bus configuration of the 16-bit width to have the (2, 1, 5) convolution code function.

According to the preferred embodiment of the present invention, there is provided the DSP including the convolution code generator. For example, a DSP exclusively designed for a cellular phone includes the convolution code generator and stores a program thereof, thus data of a broad bit width supplied by the DSP can be more effectively utilized and the planning thereof becomes relatively easy. Further, the number of convolution coding operation cycles is reduced and the size of an assembly code of the DSP decreases.

It will be apparent to those skilled in the art that various modifications and variations can be made in the convolution code generator and digital signal processor which includes the same of the present invention without departing from the spirit or scope of the invention. Thus, it is intended that the present invention cover the modifications and variations of this invention provided they come within the scope of the appended claims and their equivalents.

What is claimed is:

1. A convolution code generator, which generates an (n, k, m) convolution code, wherein n is a code word length, k is a message block length, and m is a memory block, comprising:

a temporary data storing means for temporarily storing input data of a word of a predetermined data width consisting of a plurality of bits, said temporary data storing means including cells of a first group corresponding to a word and m−1 cells of a second group wherein m−1 cells of the first group are coupled in parallel to the m−1 cells of the second group for the purpose of transferring data in parallel to the m−1 cells of the second group; and a plurality of exclusive logic operation means connected to each of the cells of the said first and second groups for generating said (n, k, m) convolution code with respect to input bits stored in the cells of the first group, wherein a part of data of a previous word is stored in the cells of said second group with respect to a present word stored in the cells of said first group, wherein the word is encoded in a single cycle, wherein a number of the plurality of exclusive logic operation means is equal to one less than a number of cells in the first and second groups of cells and each of the plurality of exclusive logic operation means is connected to a different pair of adjacent cells in the first and second groups of cells, wherein the convolution code generator further comprises a second plurality of exclusive logic operation means including a first and second exclusive logic operation means corresponding to each cell of the first group of cells, wherein each of the first exclusive logic operation means are connected to said each corresponding cell and a corresponding one of the plurality of exclusive logic operation means, and wherein each of the second exclusive logic operation means is connected to a corresponding pair of the plurality of exclusive logic operation means.

2. The convolution code generator according to claim 1, wherein said (n, k, m) convolution code is a (2, 1, 5) convolution code.

3. The convolution code generator of claim 1, wherein the input data is transferred into the temporary data storing means in parallel.

4. A convolution code generator, which generates a (2, 1, 5) convolution code, wherein 2 is a code word length, 1 is a message block length, and 5 is a memory block, comprising:

a temporary data storing means for temporarily storing input data of a word of a predetermined data width consisting of a plurality of bits, said temporary data storing means including cells of a first group corresponding to a word and 4 cells of a second group, wherein the input data is transferred into the temporary data storing means in parallel, and wherein 4 cells storing 4 highest bits of the first group are coupled in parallel to the 4 cells of the second group for the purpose of transferring data to the 4 cells of the second group; and a plurality of exclusive logic operation means selectively connected to the cells of said first and second groups for generating said (2, 1, 5) convolution code with respect to input bits stored in the cells, wherein 4 highest bits of a previous word is stored in the cells of the second group with respect to a present word stored in the cells of the first group, said plurality of exclusive logic operation means including first to fourth exclusive logic operation means for performing exclusive logic operations of the cells of the first group which are adjacent to each other, and wherein a number of the plurality of exclusive logic operation means is equal to one less than a number of cells in the first and second groups of cells;

an exclusive logic operation means for performing an exclusive logic operation of a cell in which a bit is stored and an output of said fourth exclusive operation means to generate a first convolution code with respect to said bit; and another exclusive logic operation means for performing an exclusive logic operation of outputs of said first and fourth exclusive operation means to generate a second convolution code with respect to said bit.

5. The convolution code generator according to claim 4, wherein said input data has a 16, 24, or 32-bit width.

6. The convolution code generator according to claim 4, wherein the temporary data storing means includes a D-flipflop.

7. The convolution code generator of claim 4, wherein the plurality of exclusive logic operation means are connected to each of the cells of the said first and second groups for generating said (n, k, m) convolution code with respect to input bits stored in the cells, and wherein the word is encoded in a single cycle.

8. A digital signal processor for processing a digital input, which includes a memory, an accumulator and a plurality of signal processing units and has a bus connected with said devices for input/output of data, comprising:

a convolution code generating means for generating a (n, k, m) convolution code, wherein n is a code word length, k is a message block length, and m is a memory block, and for loading said convolution code to said accumulator through said bus, said convolution generating means including:

a convolution code generator having a temporary data storing means for temporarily storing input data of a word of a predetermined data width consisting of a plurality of bits, said temporary data storing means including cells of a first group corresponding to a word and m−1 cells of a second group, wherein m−1 cells of the first group are coupled in parallel to the m−1 cells of the second group for the purpose of transferring data in parallel to the m−1 cells of the second group; and a plurality of exclusive logic operation means, wherein at least one of the exclusive logic operation means is connected to each corresponding cell of said first and second groups for generating said (n, k, m) convolution code with respect to input bits stored in the cells of the first group, wherein a part of data of a previous word is stored in the cells of said second group with respect to a present word stored in the cells of said first group, and wherein said (n,k,m) convolution code is concurrently generated for all cells of the first group.

9. The digital signal processor according to claim 8, wherein the convolution code generator which generates a (2, 1, 5) convolution code, wherein 2 is a code word length, 1 is a message block length, and 5 is a memory block, includes:

a temporary data storing means for temporarily storing input data of a word of a predetermined data width consisting of a plurality of bits, said temporary data storing means including cells of a first group corresponding to a word and 4 cells of a second group; and a plurality of exclusive logic operation means selectively connected to the cells of said first and second groups for generating said (2, 1, 5) convolution code with respect to input bits stored in the cells, wherein a part of data of a previous word is stored in the cells of the second group with respect to a present word stored in the cells of the first group, said plurality of exclusive logic operation means including;

first to fourth exclusive logic operation means for performing exclusive logic operations of the cells of the first group which are adjacent to each other;

an exclusive logic operation means for performing an exclusive logic operation of a cell in which a bit is stored and an output of said fourth exclusive operation means to generate a first convolution code with respect to said bit; and another exclusive logic operation means for performing an exclusive logic operation of outputs of said first and fourth exclusive operation means to generate a second convolution code with respect to said bit.

10. The digital signal processor according to claim 8, wherein said input data has a 16, 24, or 32-bit width.

11. The digital signal processor according to claim 8, wherein the temporary data storing means includes a D-flipflop.

12. The convolution code generator of claim 7, wherein the word is encoded in a single cycle, wherein the convolutional code generating means generates an (n,k,m) convolution code for a next word by concurrently transfering the data of the m−1 cells of the first group to the m−1 cells of the second group and storing the next word in the first group of cells and then concurrently generating said next word (n,k,m) convolutional code using all cells of the first and second groups of cells.

13. The convolution code generator of claim 8, wherein a number of the plurality of exclusive logic operation means is equal to one less than a number of cells in the first and second groups of cells and each of the plurality of exclusive logic operation means is connected to a different pair of adjacent cells in the first and second groups of cells.

* * * * *